US006457478B1

United States Patent
Danese

(12) United States Patent
(10) Patent No.: US 6,457,478 B1
(45) Date of Patent: Oct. 1, 2002

(54) METHOD FOR TREATING AN OBJECT USING ULTRA-VIOLET LIGHT

(76) Inventor: Michael J. Danese, 22025 Creekside Ct., Cupertino, CA (US) 95014

( * ) Notice: Subject to any disclaimer, the term of this patent is extended or adjusted under 35 U.S.C. 154(b) by 0 days.

(21) Appl. No.: 09/439,474

(22) Filed: Nov. 12, 1999

(51) Int. Cl.$^7$ ................................. B08B 7/00
(52) U.S. Cl. .......................... 134/1.3; 134/3; 134/26; 134/32; 134/37; 134/902
(58) Field of Search ............................... 134/1.3, 11, 3, 134/37, 32, 26, 902

(56) References Cited

U.S. PATENT DOCUMENTS

| | | | |
|---|---|---|---|
| 4,643,774 A | 2/1987 | Kishida et al. ................ 134/1 |
| 4,714,086 A | 12/1987 | Kishida et al. ............... 134/83 |
| 4,735,000 A | 4/1988 | Hayashi et al. ................ 34/58 |
| 4,736,760 A | 4/1988 | Coberly et al. ............. 134/134 |
| 4,738,759 A | 4/1988 | Bienvenu et al. |
| 4,984,597 A | 1/1991 | McConnell et al. .......... 134/95 |
| 5,173,988 A | 12/1992 | Bhatia et al. ............... 15/309.2 |
| 5,217,559 A | 6/1993 | Moslehi et al. ............. 156/345 |
| 5,232,511 A | * 8/1993 | Bergman ...................... 134/2 |
| 5,248,456 A | * 9/1993 | Evans et al. .................. 264/22 |
| 5,331,987 A | 7/1994 | Hayashi et al. .......... 134/102.1 |
| 5,370,741 A | * 12/1994 | Bergman ...................... 134/3 |
| 5,395,482 A | * 3/1995 | Onda et al. ................. 156/646 |
| 5,443,540 A | 8/1995 | Kamikawa .................... 34/471 |
| 5,505,785 A | 4/1996 | Ferrell ........................... 134/1 |
| 5,520,744 A | 5/1996 | Fujikawa et al. ............. 134/11 |
| 5,542,441 A | 8/1996 | Mohindra et al. ......... 134/95.2 |
| 5,571,337 A | 11/1996 | Mohindra et al. ......... 134/25.4 |
| 5,634,978 A | 6/1997 | Mohindra et al. ............. 134/2 |
| 5,651,379 A | 7/1997 | Mohindra et al. ......... 134/95.2 |
| 5,653,045 A | 8/1997 | Ferrell ........................... 34/341 |
| 5,685,086 A | 11/1997 | Ferrell ........................... 34/61 |
| 5,685,327 A | 11/1997 | Mohindra et al. ......... 134/95.2 |
| 5,685,951 A | * 11/1997 | Torek et al. .............. 156/646.1 |
| 5,772,784 A | 6/1998 | Mohindra et al. ............. 134/21 |
| 5,814,156 A | 9/1998 | Elliott et al. .................... 134/1 |
| 5,835,678 A | * 11/1998 | Li et al. ...................... 392/401 |
| 5,849,104 A | 12/1998 | Mohindra et al. ......... 134/25.4 |
| 5,868,150 A | 2/1999 | Mohindra et al. .......... 134/135 |
| 5,873,947 A | 2/1999 | Mohindra et al. ............. 134/18 |
| 5,878,760 A | 3/1999 | Mohindra et al. ......... 134/95.2 |
| 5,884,640 A | 3/1999 | Fishkin et al. ............. 134/95.2 |
| 5,891,256 A | 4/1999 | Mohindra et al. ............. 134/2 |
| 5,897,844 A | 4/1999 | Amme et al. ................ 422/186 |
| 5,909,741 A | 6/1999 | Ferrell ........................... 134/1 |
| 6,143,081 A | * 11/2000 | Shinriki et al. .............. 118/719 |
| 6,217,665 B1 | * 4/2001 | Suzuki ........................... 134/1 |

OTHER PUBLICATIONS

Froeschle et al., Characterization of Oxide Etching And Wafer Cleaning Using Vapor–Phase Anhydrous HF and Ozone, 1997, Material Research Socieyt Symposium, Proc., vol. 470, pp. 237–242.*

* cited by examiner

Primary Examiner—Randy Gulakowski
Assistant Examiner—Michael Kornakov
(74) Attorney, Agent, or Firm—Townsend and Townsend and Crew LLP

(57) ABSTRACT

A method for treating an object is provided. The method comprises supporting the object above a level of a process liquid and applying megasonic energy to said process liquid to form a vapor from the liquid. The vapor reacts with a surface of the object to process the object. The level of the process liquid is generally maintained below the bottom of the object while processing the object with the vapor. An alternative embodiment of the method employs an acoustically generated vapor and ultraviolet (UV) light for processing objects. The UV light passes through the vapor to treat the object. The vapor and UV light react with a surface of the object to process the object. In a particular example of this embodiment, the vapor includes ozone, which reacts with the UV light to form an oxide at the surface of a semiconductor wafer. UV may also be used in conjunction with ammonia ($NH_3$) to facilitate substrate cleaning.

23 Claims, 6 Drawing Sheets

METHOD FOR TREATING AN OBJECT USING ULTRA-VIOLET LIGHT

This application is related to U.S. patent application Ser. No. 09/439,613 now abandoned entitled METHOD FOR DRYING AN OBJECT USING A SINGLE OBJECT TOOL in the name of Michael Danese, and to U.S. patent application Ser. No. 09/442,041 now abandoned, filed the same date as this application) entitled APPARATUS FOR DRYING AN OBJECT USING A SINGLE OBJECT TOOL in the name of Michael Danese, and to U.S. patent application Ser. No. 09/442,043 now U.S. Pat. No. 6,272,768, entitled APPARATUS FOR TREATING AN OBJECT USING ULTRA-VIOLET LIGHT filed the same date as this application) in the name of Michael Danese, all of which are incorporated by reference herein.

BACKGROUND OF THE INVENTION

The present application generally relates to treatment of objects. More particularly, the present invention provides an improved method for processing substrates with ultraviolet light in a single substrate wet processing tool. The invention also provides for improved processing of substrates with a vapor.

In a wet chemistry process a substrate is immersed in or otherwise treated with a liquid chemical solution. Examples of wet process steps include etching, photoresist stripping, removal of oxides with acids such as hydrofluoric acid (HF) and cleaning. Substrates that are processed in this manner include semiconductor wafers, hard disk media, stepper masks, and flat panels. It is often important that cleaning and etching processes do not damage the substrate, the process apparatus, or features formed on the substrate. Also, the etching apparatus is desirably easily scaled to process many substrate sizes, including large area wafers that are 300 millimeters or more in diameter.

To process wafers efficiently, single substrate tools have been developed that allow simultaneous processing of single substrates in multiple chambers that implement different steps of the process. Such single substrate tools generally reduce the time that any given chamber remains idle. The equipment conventionally used for wet processing substrates generally includes a series of tanks or sinks containing the chemical solution into which racks of semiconductor wafers are dipped. Since the tanks are typically open to the atmosphere, airborne particulates can enter into the process solutions. Through surface tension these particles are easily transferred to the wafer surfaces as the wafers are dipped into and lifted out of the sinks. This particulate contamination is detrimental to the microscopic circuits that the wafer fabrication process creates.

To reduce particulate contamination, some wet processes use ultrasonic energy to assist wafer cleaning and drying. In an ultrasonic wafer cleaning process, for example, a non-reactive vessel or container is filled with an acidic cleaning solution such as sulfuric acid/hydrogen peroxide or hydrochloric acid/hydrogen peroxide, and the solution is ultrasonically vibrated to remove contamination from a wafer surface. Such an ultrasonic cleaning process is described in detail in U.S. Pat. Ser. No. 5,505,785 assigned to Gary W. Ferrell. The ultrasonic vibration is believed to cause an acoustic streaming of the cleaning solution, which induces a microflow of the solvent across the surface of the wafer. This induced microflow provides for quick and efficient cleaning of the wafer at reduced temperatures.

In an ultrasonic drying process wafers are dried by a mist of ultrafine droplets. Such an ultrasonic drying process is described in detail in U.S. Pat. Ser. No. 5,653,045 assigned to Gary W. Ferrell. Typically, the wafers are immersed in de-ionized water as nitrogen-pressurized isopropyl alcohol (IPA) flows to a sonic head attached to the top of the drying chamber. The sonic head vibrates at about 100 kilohertz to produce a mist or fog of ultrafine IPA droplets having an average diameter of about 20 microns. A low-velocity gas nozzle coupled to the sonic head distributes the droplets into the drying chamber. The IPA mist settles on the surface of the de-ionized water and forms a film that partially diffuses into the water. The de-ionized water is then slowly drained from the drying chamber so that the low surface tension of the IPA film forces the de-ionized water from the surface of the wafers in a uniform sheet. After the de-ionized water has been completely drained from the drying chamber, hot nitrogen is introduced into the drying chamber to ensure drying of the wafers. Unfortunately, the slow rate at which the water is drained limits produces bottlenecks in single wafer processing tools.

Surface contaminants frequently comprise organic molecules. One technique for removing these contaminants from semiconductor wafers uses ultraviolet (UV) light to provide energy for chemical reactions such as wafer cleaning and oxide formation. Although it has long been known that ultraviolet (UV) light decomposes organic molecules, only in the last few years has UV cleaning of surfaces been explored. One such cleaning scheme is described in U.S. Pat. Ser. No. 5,814,156, assigned to UVTech Systems, Inc. In this scheme, a surface, contaminated by adsorbed hydrocarbons, is irradiated with UV light in an atmosphere of a reactive gas such as oxygen. The contaminants absorb the UV radiation and become excited. At low energy levels the bonds between the contaminant molecules and the surface tend to break and an inert gas can be used to carry away the debris. At higher energy levels some contaminant molecules tend to dissociate from the surface into free radicals that react with atomic oxygen, produced by the dissociation of ozone, to form carbon dioxide, water and nitrogen, while other contaminants tend to heat and expand quickly away from the surface.

If the UV light is produced outside the vacuum chamber, a window, typically made of quartz, couples the UV into the chamber. The window must be made thick since it must withstand a pressure difference on the order of 1 atmosphere (760 torr). Generally, the thicker the window the greater the attenuation of the UV.

In another cleaning scheme, a surface is irradiated in ambient air by laser pulses aimed normal to the surface to produce a spot size of several millimeters. Surface contaminants absorb the UV laser pulses, expand from highly localized heating, and accelerate away from the surface. The resulting particles are carried away with water or inert gas. Because this scheme takes place in ambient air, particulate contamination is a potential problem.

Dry processing in a plasma can generate a large amount of energetic UV photons via plasma afterglow emission. Such a plasma UV processing scheme is described in U.S. Pat. Ser. No. 5,217,559 assigned to Texas Instruments. These UV photons are produced in situ and can be used for photochemical processing with minimal attenuation. Unfortunately, plasma processing techniques require a large amount of process gases. Typically, only a small percentage of these process gases participate in useful chemical reactions. Hence, a large portion of the process gases is wasted. Even worse, the process gases can actually etch and damage the reaction chamber containing the plasma, necessitating frequent maintenance. Furthermore, the substrate that is being processed is often exposed to the high temperature and energetic ions of the plasma. Semiconductor devices with fine geometry features can easily be damaged by the temperatures and ion bombardment associated with plasma processing. Further, high temperatures severely limit the kinds of processes that are available. Substrates having metal structures, polyamide structures, or soft glass structures cannot be exposed to high temperatures.

An additional drawback of known single substrate processing tools is the mechanical pick-up attached to the robot arm. Ideally, the pick-up should minimally contact the surface of the substrate. The pick-up generally has one or more "fingers" that grip the edge of the substrate. This does not present a problem for small diameter substrates such as six-inch semiconductor wafers. However, as the substrate diameter becomes larger it becomes more difficult for the pick-up to grip the wafer without bending or dropping them. Furthermore, stress applied at the edge of a substrate containing multiple thin films can cause delamination of the films. Liquid also tends to collect at edge contact points.

Furthermore, today's 300-mm wafers are very susceptible to contamination on both the front and back sides. Such wafers are generally polished on both the front and back sides. In most plasma processing techniques, however, the wafer typically rests on or adheres to a substrate support and only one side of the wafer is exposed. It would be desirable to use UV in a single wafer tool wet process since damage to the wafer can be minimized, both sides of the wafer can be exposed to UV and particulate contamination can be controlled. Unfortunately, UV light is strongly attenuated by most liquids. UV light generally penetrates only a few millimeters into water based liquid solutions. Therefore, although UV processing is now common in vacuum, plasma, or dry gas substrate processing, UV light is not normally used in wet processing.

Therefore, a need exists in the art for a fast clean and efficient method and apparatus for processing an object using with ultraviolet light a single object tool wet processing system.

SUMMARY OF THE INVENTION

According to the present invention, a method for treating an object is provided. The method is particularly suited to wet processing substrates in a single substrate processing system. The method comprises supporting the object above a level of a process liquid and applying megasonic energy to said process liquid to form a vapor from the liquid. The vapor reacts with a surface of the object to process the object. In an exemplary embodiment, the vapor contains an acid such as HF for stripping native oxide from semiconductor wafers. The level of the process liquid is generally maintained below the bottom of the object while processing the object with the vapor. In an alternative embodiment the transducers continuously apply megasonic energy as the liquid level rises or lowers so that there is a smooth transition from liquid processing to vapor processing or vice versa.

An alternative embodiment of the method employs an acoustically generated vapor and ultraviolet (UV) light for processing objects. The UV light passes through the vapor to treat the object. The vapor and UV light react with a surface of the object to process the object. In a particular example of this embodiment, the vapor includes ozone, which reacts with the UV light to form an oxide at the surface of a semiconductor wafer. UV may also be used in conjunction with ammonia ($NH_3$) to facilitate substrate cleaning.

The method can be implemented as a program code stored in a computer readable storage medium. The program code controls the operation of a substrate wet processing system during object processing. The present invention provides for fast clean and efficient processing of objects at low temperatures. These and other embodiments of the present invention, as well as its advantages and features are described in more detail in conjunction with the text below and attached figures.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

The present invention allows for efficient processing of objects with UV in a single object wet processing tool. A cloud or mist, formed from a process liquid, processes the object. UV light, transmitted through the cloud, further enhances processing of the object. A pick-up that manipulates the object minimizes bending stress on the object by adhering to a backside thereof.

Figure 1:
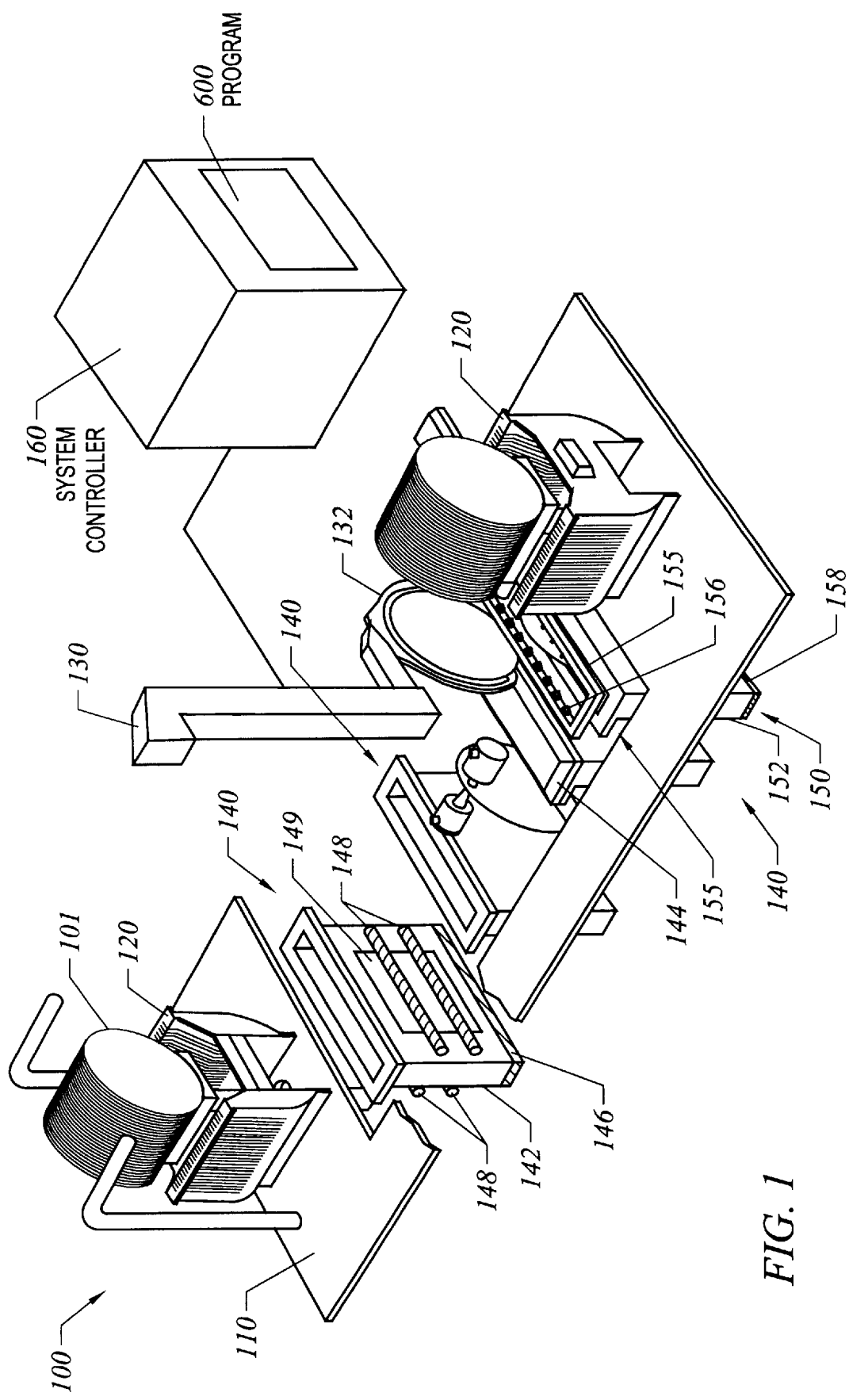
FIG. 1 shows a perspective view of an exemplary wet processing system employing an aspect of the present invention.

FIG. 1 shows a schematic diagram of a wet processing system 100 in which the present invention can be practiced. This diagram is merely an illustration and should not limit the scope of the claims herein. The depicted system is illustratively a substrate cleaning system. The invention, however, is applicable to any wet processing system. The system generally comprises a bench 110, substrate containers 120, a robot arm 130, a plurality of wet process chambers 140, and a rinse/dry chamber 150. The system 100 also includes a controller 160 for automated control of the robot arm 130, the process chambers 140 and the rinse/dry chamber 160.

The bench 110 is typically made of a durable chemical resistant material. This material should be relatively easy to work with and also provide suitable structural support. Only a portion of the bench 110 is shown for clarity. The bench is typically part of a larger housing that encloses the wet process chambers 140 and the rinse/dry chamber 150.

Substrate containers 120 contain substrates 101 that are to be processed by the system 100. In semiconductor wafer processing the wafer containers are often referred to as wafer boats. Such wafer boats typically contain 20 or more semiconductor wafers. An exemplary wafer boat contains approximately twenty-five six-inch wafers, and has a width of about seven inches and a length of about five and one-half inches. Other than six-inch wafers, substrate containers 120 can hold smaller wafers such as five-inch, four-inch, three-inch, two-inch, and one-inch wafers. Alternatively, substrate container 120 can hold larger wafers such as eight-inch, ten-inch, twelve-inch, and greater, depending upon the application.

Robot arm 130 transfers substrates 101 between containers 120 wet process chambers 140, and a rinse/dry chamber 150. The robot arm 130 includes a pick-up 132 that retains a substrate 101 to facilitate transfer of a single substrate 101 at a time. Although a robot arm that transfers a single substrate is depicted and described herein, robot arms having multiple pick-ups or a single pick-up capable of handling multiple substrates at a time are considered to be within the scope of the present invention. The pick-up 132 typically grips a periphery of the substrate 101 and retains the substrate 101 by mechanical action. In a preferred embodiment of the present invention, the pick-up 132 is a vacuum wand that adheres to a backside of the substrate 101. The term backside herein refers to the side of the substrate that does not normally require processing to form features. For example, if the substrate 101 is a semiconductor wafer, features, such as integrated circuit elements, are formed on only one side (the front side). Thus the side of the wafer on which circuit elements are not formed constitutes the backside.

Substrates 101 are processed in wet process chambers 140. A typical process chamber includes a reservoir 142 that contains a process liquid solution and a lid 144. Lids 144 can open and close in response to signals from controller 160. Process chambers 140 implement such chemical processes as etching, photoresist stripping, removal of oxides, and substrate cleaning. By way of example, chambers 140 are substrate cleaning chambers. Other process chambers can also be coupled to the present cleaner such as scrubbers, chemical mechanical polish (CMP) chambers, and the like. One or more of wet process chambers 140 includes an megasonic transducer 146 and a UV source 148. Transducer 146 is coupled to a bottom 143 of reservoir 142. One or more UV sources 148 provide UV light through a window 149 in reservoir 142.

After processing in wet process chambers 140, the substrates 101 are typically rinsed and dried in rinse/dry chamber 150. Rinse/dry chamber 150 typically includes a rinse tank 152 and a drying mechanism 154. Rinse tank 152 contains a rinse liquid such as a solution containing deionized (DI) water. In one embodiment of the present invention, the rinse/dry chamber, the drying mechanism 154 is an air-knife. The air knife includes a manifold 155 having a plurality of nozzles 156 that direct a high velocity stream of air or other gas at the substrate 101. The high velocity stream dries the substrate by stripping away excess liquid. Rinse chamber 150 may also include an megasonic transducer 158 and UV source (not shown).

Figure 2:
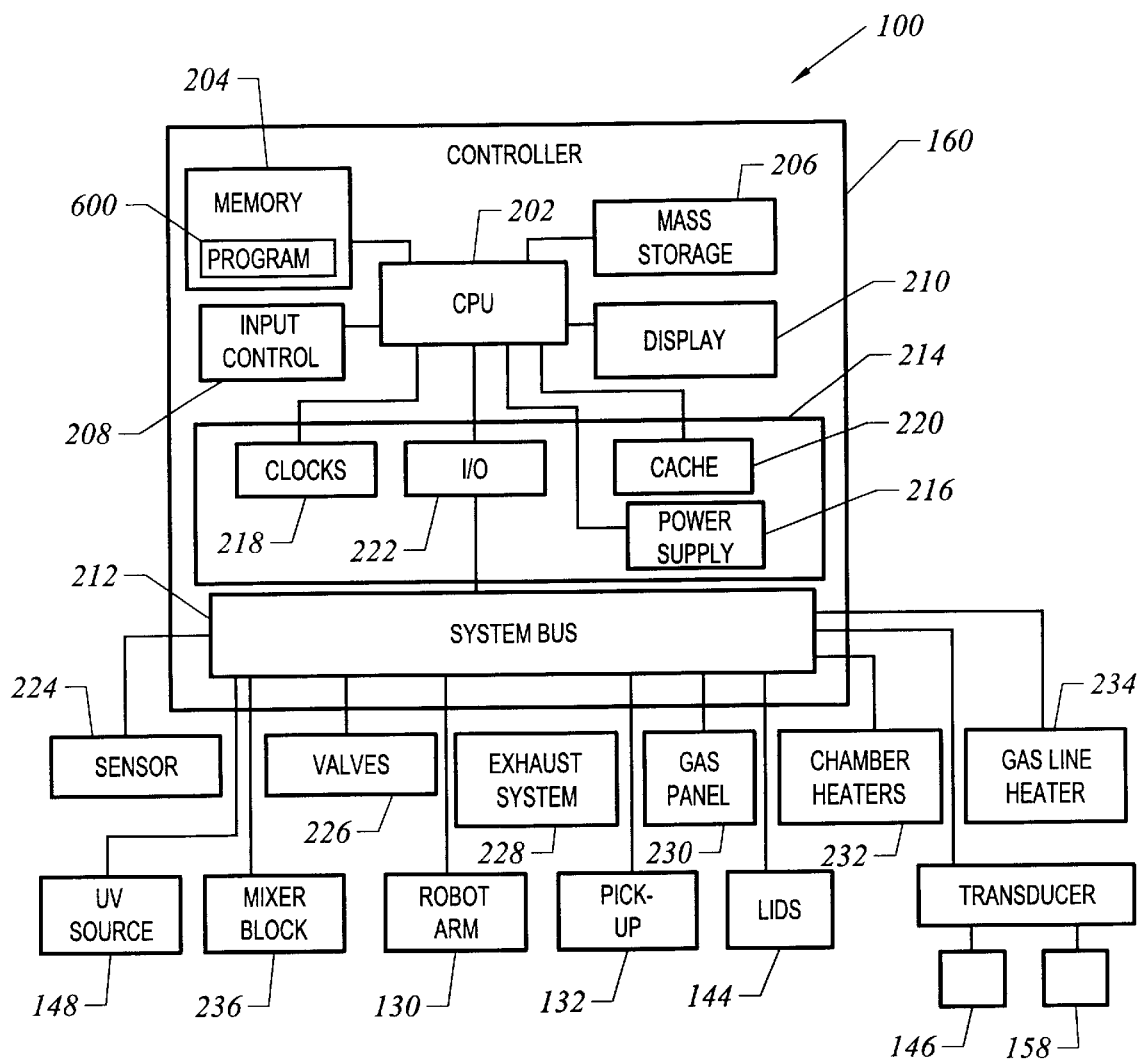
FIG. 2 shows a block diagram of the wet processing system of FIG. 1.

Controller 160 produces the necessary signals to operate system 100 in accordance with the present invention. FIG. 2 shows a block diagram of processing system 100. The system controller 160 includes a programmable central processing unit (CPU) 202 that is operable with a memory 204, a mass storage device 206, an input control unit 208, and a display unit 210. The system controller further includes well-known support circuits 214 such as power supplies 216, clocks 218, cache 220, input/output (I/O) circuits 222 and the like. The controller 160 also includes hardware for monitoring substrate processing through sensors 224 in the process chambers 140 and rinse/dry chamber 150. Such sensors measure system parameters such as liquid temperature, pH liquid level, gas and liquid flow rates and the like. All of the above elements are coupled to a control system bus 212.

The memory 204 contains instructions that the CPU 202 executes to facilitate the performance of the processing system 200. The instructions in the memory 204 are in the form of program code such as a program 600 that implements the method of the present invention. The program code may conform to any one of a number of different programming languages. For example, the program code can be written in C, C++, BASIC, Pascal, or a number of other languages.

The mass storage device 206 stores data and instructions and retrieves data and program code instructions from a processor-readable storage medium, such as a magnetic disk or magnetic tape. For example, the mass storage device 206 can be a hard disk drive, floppy disk drive, tape drive, or optical disk drive. The mass storage device 206 stores and retrieves the instructions in response to directions that it receives from the CPU 202. Data and program code instructions that are stored and retrieved by the mass storage device 206 are employed by the processor unit 202 for operating the processing system 200. The data and program code instructions are first retrieved by the mass storage device 206 from a medium and then transferred to the memory 204 for use by the CPU 202.

The input control unit 208 couples a data input device, such as a keyboard, mouse, or light pen, to the processor unit 202 to provide for the receipt of a chamber operator's inputs. The display unit 210 provides information to a chamber operator in the form of graphical displays and alphanumeric characters under control of the CPU 202.

The control system bus 212 provides for the transfer of data and control signals between all of the devices that are coupled to the control system bus 212. Although the control system bus is displayed as a single bus that directly connects the devices in the CPU 202, the control system bus 212 can also be a collection of buses. For example, the display unit 210 input control unit 208 and mass storage device 206 can be coupled to an input-output peripheral bus, while the CPU 202 and memory 204 are coupled to a local processor bus. The local processor bus and input-output peripheral bus are coupled to form the control system bus 212.

The system controller 160 is coupled to the elements of the processing system 200, employed in etch processes in accordance with the present invention via the system bus 212 and the I/O circuits 222. These elements include the following: sensors 224, a plurality of valves 226 (for controlling gas and liquid flow), an exhaust system 228, a gas panel 230, robot arm 130, pick-up 132, process chamber lids 144, megasonic transducers 146, 158, UV source 148, one or more chamber heaters 232, a gas line heater 234 and an optional mixer block 236 (for mixing different gases or mixing gases and liquids). The system controller 160 provides signals to the chamber elements that cause these elements to perform operations for forming a layer of copper in the subject apparatus.

Although the invention is described herein as being implemented in software and executed upon a general purpose computer, those skilled in the art will realize that it would be a matter of routine skill to select an appropriate computer system to control processing system 200. Those of skill in the art will also realize that the invention could be implemented using hardware such as an application specific integrated circuit (ASIC) or other hardware circuitry. As such, it should be understood that the invention could be implemented, in whole or in part, in software, hardware or both.

Figure 3:
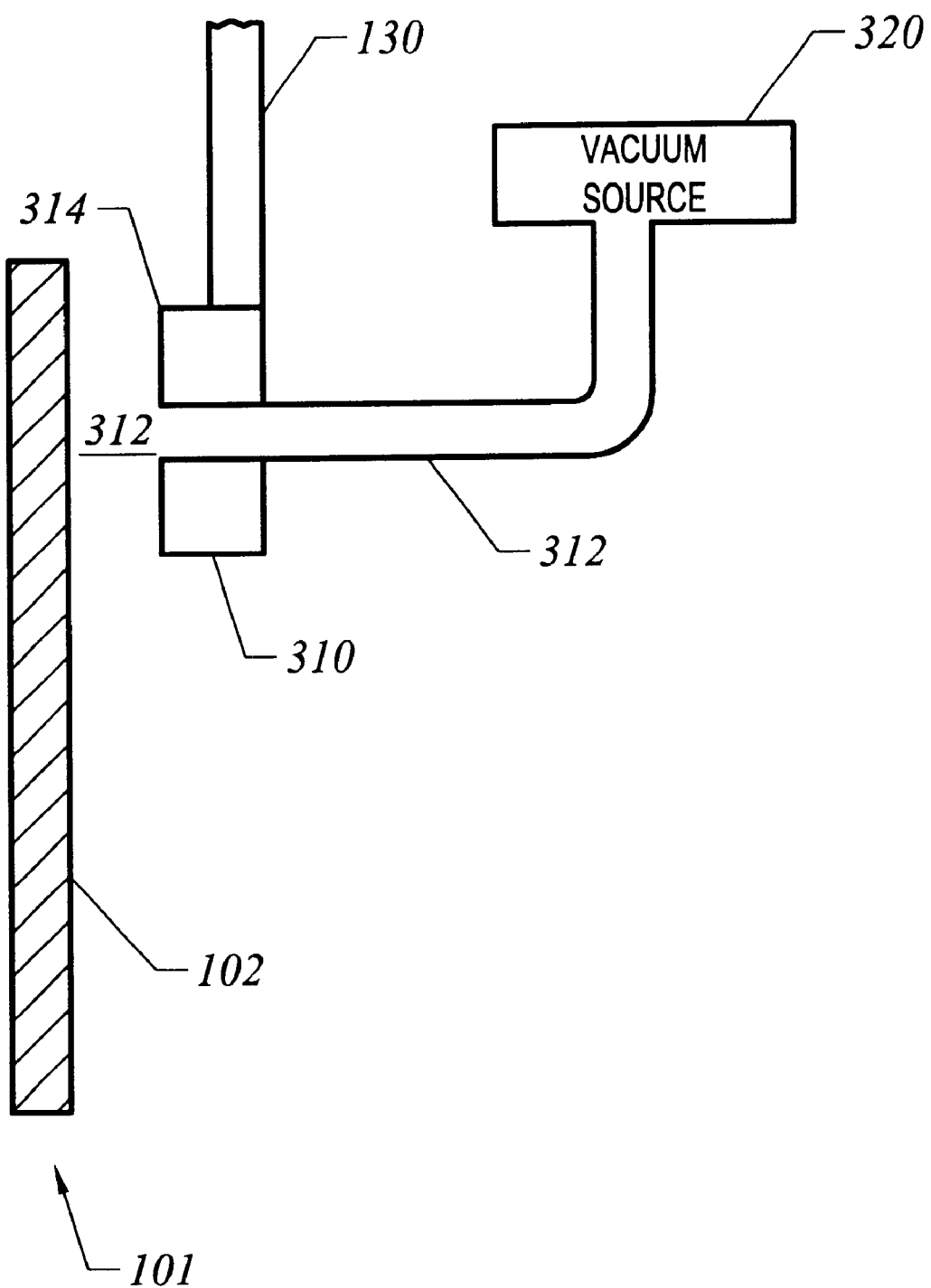
FIG. 3 shows a close-up cross-section of a substrate pick-up according to an embodiment of the present invention.

The present invention provides for a substrate pick-up to grip and retain a substrate 101 by a backside after wet processing. FIG. 3 depicts a close-up of such a substrate pick-up 300. Substrate pick-up 300 is typically attached to robot arm 130 to facilitate substrate transfer. In a preferred embodiment, pick-up 300 is a vacuum wand. Pick-up 300 generally includes an adhesion pad 310 coupled to a vacuum source 320. A vacuum line 312 typically connects vacuum source 320 to adhesion pad 310 via an orifice 314. Vacuum source 320 is, for example, a vacuum pump of conventional type used for withdrawing fluid. Such pumps include rotary vane pumps, roots pumps, bellows type pumps, venturi effect pumps, etc. The term fluid herein is intended to mean both liquids and gases. As such, it should be understood that vacuum source 320 is not limited to pumps that withdraw gas but also includes devices such as aspirators that withdraw liquids.

Vacuum source 320 draws air or other gas from between adhesion pad 310 and a backside 102 of substrate 101. Substrate 101 is oriented in a substantially vertical direction. As air or other fluid is drawn from a region 312 between adhesion pad 310 and a backside 102 of substrate 101 a partial vacuum is created in space 312. Partial vacuum herein refers to a situation in which the fluid pressure in region 312 is lower than the fluid pressure in the surrounding region. As a result of the partial vacuum in region in 312, the fluid in surrounding region forces adhesion pad 310 and substrate 101 together. Friction between adhesion pad 310 and substrate backside 102 supports substrate 101 against the force of gravity. The force of friction depends on the product of the adhering force pushing substrate 101 and adhesion pad 310 together and the coefficient of friction of the interface between substrate backside 101 and adhesion pad 310. Although pick-up 300 is described herein as a vacuum wand, pick-up 300 is not limited herein to implementation as a vacuum wand. Alternatively, pick-up 300 can adhere to backside 102 of substrate 101 by an electrostatic or magnetic force of attraction.

Generally the greater the adhering force pushing substrate 101 and adhesion pad 310 together the greater the maximum force of friction and thus the greater weight of substrate pick-up 300 can support. Adhesion pad 310 is typically made of an elastomeric material such as Teflon. By adhering to and retaining substrate 101 in this fashion, the substrate pick-up 300 minimizes bending stress on the substrate 101. As such, substrate 101 is less likely to break or deform as a result of handling. Furthermore, the substrate pick-up 300 of the present invention is simple in design and has no moving parts that can generate particles.

The present invention provides for apparatus for wet processing a substrate with a vapor and UV light. UV light, in this application is understood to mean electromagnetic radiation having a wavelength of between about 0.1 nanometers (nm) and about 400 nm. Although the invention is described in terms of UV light those skilled in the art will recognize that the method and apparatus of the present invention are readily adapted to substrate processing with any type of electromagnetic radiation. The method is particularly suited for radiation normally strongly attenuated by a given process chemical in the liquid state. For example, although liquid water is relatively transparent to visible radiation having wavelengths between about 400 nm and 700 nm and radiofrequency (RF) radiation having wavelengths above about 30 cm. Nearly all other bands of the electromagnetic spectrum are strongly attenuated.

Figure 4:
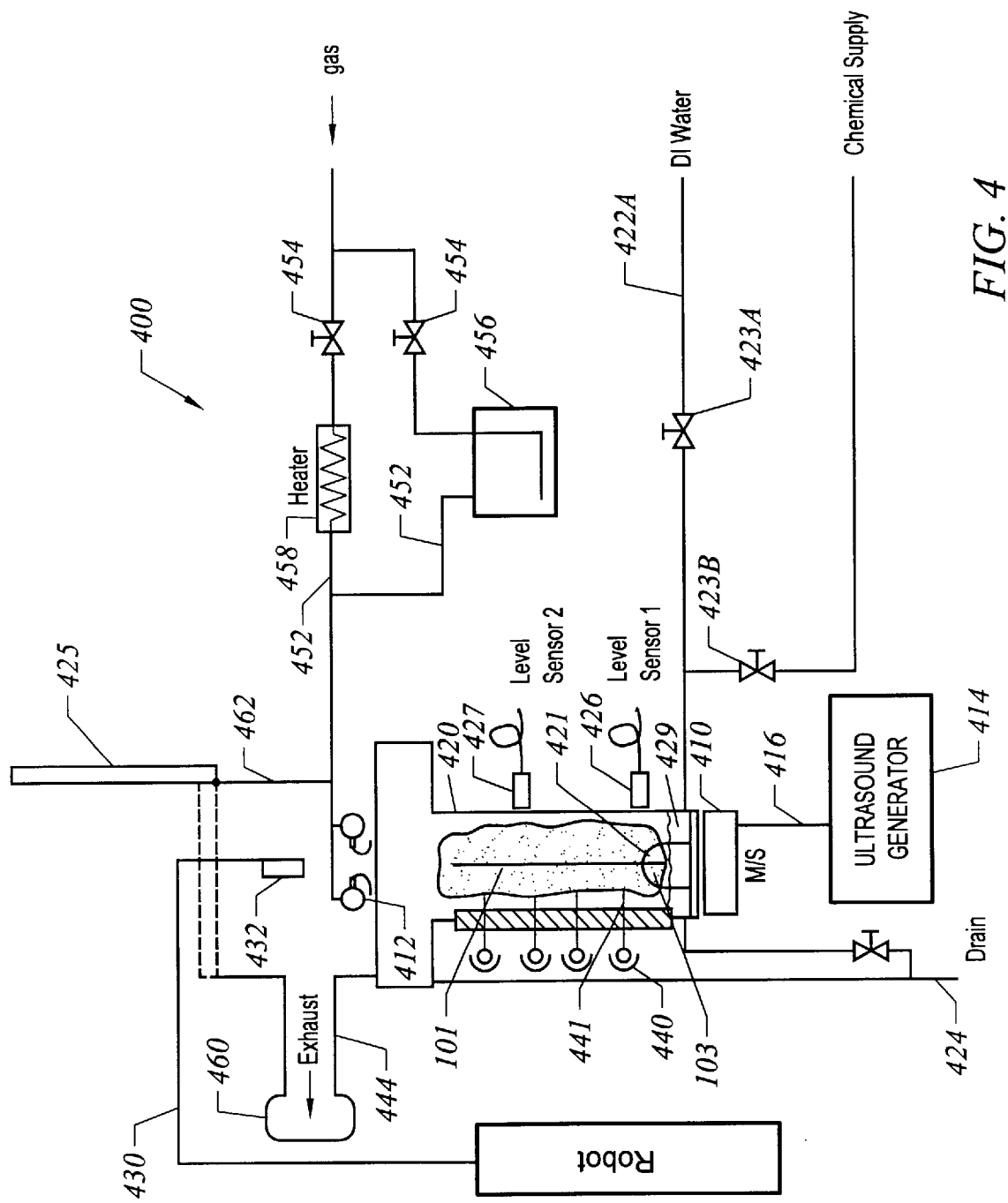
FIG. 4 shows a partial cross-sectional schematic of a substrate processing apparatus of another embodiment of the present invention.

FIG. 4 depicts a substrate processing apparatus 400. Apparatus 400 may be incorporated into processing system 100, e.g., as part of processing chamber 140 or rinse/dry chamber 150 of FIG. 1. Processing apparatus 400 generally includes an megasonic transducer 410 coupled to a container 420, a robot arm 430 and one or more UV sources 440. Substrate 101 is oriented in a substantially vertical direction while it is in container 420. Robot arm 430 and pick-up 432 facilitate transfer substrate 101 to and from container 420. In a preferred embodiment of the invention, pick-up 432 is a vacuum wand such as that depicted in FIG. 3. Gases are supplied to a gas manifold 412 by gas lines 452 and valves 454. In some applications, a vapor, such as IPA vapor, provided by a bubbler 456, is supplied via gas lines 452. A gas line heater 458 prevents the vapor from condensing in the gas lines. An exhaust system 460 removes gas and vapor from container 420 via an exhaust chamber 462 coupled to the container 420.

Container 420 is, for example, reservoir 142 or, alternatively, rinse tank 152 of FIG. 1. A substrate holder 421, typically made of quartz, supports substrate 101 in a substantially vertical orientation in container 420 during processing. Container 420 receives process liquid 429 such as a diluent and/or process chemicals via liquid supply lines 422A, 422B and valves 423A, 423B. Process liquid 429 is removed from container 420 via drain 424. Sensors 426 and 427 determine the level of liquid in container 420. Other sensors (not shown, but generally indicated as 224 in FIG. 2) monitor temperature, pH, chemical content, etc. of the liquid in container 420. A lid 425 typically covers container 420 during processing. Lid 425 often includes a seal (not shown) so that container 420 can be sealed off from the ambient atmosphere during processing. The container 420 generally includes one or more cascade rinse weirs 429. The lid 425 and cascade rinse weirs 429 capture liquid that would otherwise splash or overflow from container 420. Cascade rinse weirs 429 communicate with container 420 and/or drain 424. The liquid captured by cascade rinse weirs 429 is either returned to container 420 or drained away.

Megasonic transducer 410 includes, for example, one or more piezoelectric elements that expand and contract in response to electric fields. One or more transducers 410, typically between two and six, are arranged on the bottom of the container 420. Transducers 410 are typically rectangular in shape having a width generally between 30 and 40 millimeters (mm) and a lengths of between 50 and 175 mm. Transducers 410 are coupled to a generator 414 via transmission line 416. Signal generator can be a stand-alone unit coupled to a system controller or operated manually. Alternatively signal generator 414 can be part of a system controller such as controller 160 of FIG. 1. Signal generator 414 provides electrical impulses that drive piezoelectric elements 412 at frequencies of between about 100 kHz and 1 MHz. Megasonic energy from transducer 410 is transmitted to the process liquid in the container 420. The megasonic energy produces a dense cloud 418 from process liquid 429. The dense cloud 418 processes the surface of substrate 101. In a preferred embodiment, transducer 410 is coupled to a bottom of container 420 below substrate holder 421 and a level L of process liquid 429 is below that of a bottom 103 of substrate 101. If the holder 421 is sufficiently thin, e.g., less than 3 mm for quartz, megasonic energy from transducer 410 passes right through holder 421 into substrate 101.

Ultraviolet sources 440 are, for example, low-pressure mercury vapor lamps or excimer lasers. Preferably UV sources 440 provide UV light in the wavelength range between approximately 150 nm and 250 nm. UV radiation in this range is effective against organic contaminants and readily penetrates the vapor 418. UV light shown by arrows 441 is transmitted from the sources to substrate 101 via one or more windows 442. Window 442 is made of a material that is transparent to ultraviolet light and resistant to chemical attack. Suitable materials include, quartz, Pyrex, sapphire, and Teflon AF. Teflon AF is particularly suitable for applications that use hydrofluoric acid (HF). Although, for the sake of clarity, only a single window 442 is depicted in FIG. 4, container 420 can have two or more windows if it is desirable to illuminate the substrate 101 with UV radiation from more than one side simultaneously. For example two or more UV sources could be used, coupled to windows adjacent front and back sides of substrate 101. Alternatively suitable optics containing beam splitters, mirrors and/or other suitable optics could be devised to direct radiation from UV source 440 to multiple sides of substrate 101.

Since container 420 is typically at ambient atmospheric pressure (approximately 760 torr), the pressure difference between the two sides of window 442 is mostly due to process liquid 429 in container 420. The pressure difference depends on the density and the depth of process liquid 429. If the process liquid 429 is generally a water-based solution, the pressure difference can be much less than atmospheric pressure. For example, even if process liquid 429 in container 420 is water 100 centimeters deep, window 442 need only be able to withstand a pressure difference of about 74 torr. Consequently window 442 can be made relatively thin, and, therefore, less attenuating, compared to windows used in vacuum systems.

The method of the present invention will now be described in more detail with reference to the above described apparatus and the preferred substrate (a semiconductor wafer), diluent (water) and drying vapor (isopropanol), although it will be understood that the method can be carried out on other substrates with other suitable apparatus, and the method will be similar for other rinsing and drying fluids.

Figure 5:
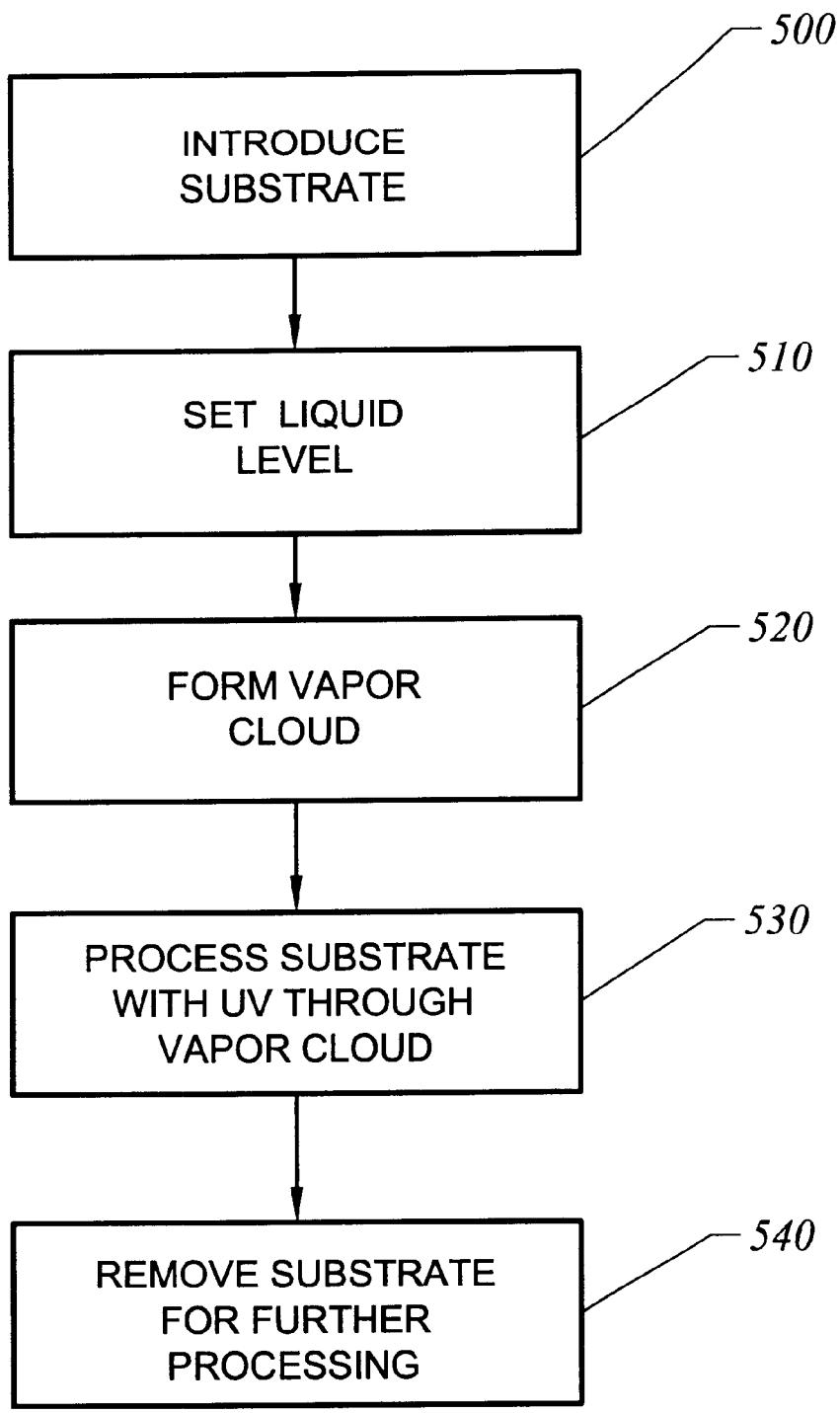
FIG. 5 shows a flow diagram of a preferred embodiment of the method of the present invention.

FIG. 5 illustrates a preferred embodiment of the method of the present invention. By this method, substrates such as semiconductor wafers can be processed using a single substrate tool incorporating conventional wet processing chambers. At 500 a substrate is introduced to container 420 for processing. Container 420 is filled with process liquid 429. The process liquid can be introduced to container 420 before the substrate, after the substrate or simultaneously with the substrate. The substrate is generally oriented in a substantially vertical direction to facilitate drying and/or rinsing. Vertical orientation is implemented, for example, by robot arm 430, pick-up 432 and/or substrate holder 421 in the container 420. At step 510 level L of process liquid 429 is set. In the present invention, level L is generally maintained below that of the substrate during processing with ultrasound.

The process liquid used is typically dependent on the process. For an etching process, such as removal of native oxide, the liquid typically contains an acid such as HCl, HF, $H_2SO_4$ diluted in deionized water. In certain cleaning processes the process liquid contains an alkali such as $NH_3$ diluted in deionized water. In a rinse/dry process, the process liquid is generally deionized water with an alcohol vapor such as isopropyl alcohol (IPA) vapor. The concentration of process liquid in the container 420 is controlled, for example, by valves 432A, 423B and drain 424. By changing inlet flow rates for process liquid and deionized water the concentration of rinse liquid can be increased or decreased by dilution.

Once the liquid level is established relative to the substrate, processing with a vapor begins at step 520. For example, signal generator 414 transmits a megasonic signal to the transducer 410. Generally, megasonic refers to a frequency of 100 kHz or greater. In a preferred embodiment the signal has a frequency of about 950 kHz. The transducer 410 converts the electrical signal to megasonic energy that is coupled through container 420 to the process liquid. The megasonic energy forms vapor 418 from process liquid 429. The vapor 418 cleans or otherwise processes the substrate 101. Note that this type of vapor processing can be done in a sealed container with either a single substrate or multiple substrates in a batch process.

In addition to enabling the use of UV, processing the substrate with the vapor 418 reduces chemical usage. There is generally a higher chemical reactivity for a chemical vapor reacting on the surface of a substrate compared to the same chemical in the bulk liquid state. For example, an exemplary cleaning process uses a 2% HF solution as the process liquid to remove native oxide from a semiconductor substrate. Only a small amount of the HF solution, e.g., enough to fill the space below the bottom of substrate 101, is used to process the substrate using vapor 418. A bulk liquid process, using the same 2% HF solution, would almost fill container 420 to completely immerse the substrate.

Substrate 101 may be processed sequentially with megasonic vapor and conventional megasonic in the same chamber by simply changing liquid level L. For example, in some semiconductor wafer processes it may be desirable to perform a native oxide strip followed by rinsing and drying. Native oxide could be removed using a megasonic vapor formed from a 2% HF solution as described above. The HF solution could then be diluted with deionized water to stop the oxide strip process, e.g. by providing deionized water via valve 423A and opening drain 424. To rinse substrate 101, liquid level L could then be raised by filling container 420 with deionized water while continuing to operate megasonic transducer 410. Subsequently, IPA could be added to the solution in container 420 and liquid level L could be reduced so that substrate 101 is dried with a megasonic IPA vapor. Note that in this embodiment, the only interval between wet processing and vapor processing is the time necessary to raise or lower the liquid level.

The substrate is often processed with ultraviolet during vapor processing. If UV processing is desired UV source 440 is turned on at step 530 and processing with UV begins. The vapor 418 surrounding substrate 101 is generally less dense than process liquid 429. Consequently, the vapor attenuates the UV less than the process liquid in the liquid state. UV processes include photoresist exposure, substrate cleaning, etching and deposition. UV processing can include an oxygen containing process gas, such as oxygen ($O_2$) or ozone ($O_3$), within the vapor. The oxygen containing process gas absorbs the UV radiation and dissociates forming atomic oxygen. The atomic oxygen reacts with the substrate to form an oxide. Alternatively, UV can be used in conjunction with $NH_3$ in a substrate cleaning process. Those skilled in the art will recognize that UV can be used to process a substrate through a vapor generated by means other than ultrasound. For example an atomizer, boiler, bubbler or the like could produce the vapor.

After UV processing is complete, the substrate is removed from container 420 at step 540 to another chamber, e.g., for rinsing or further processing.

Figure 6:
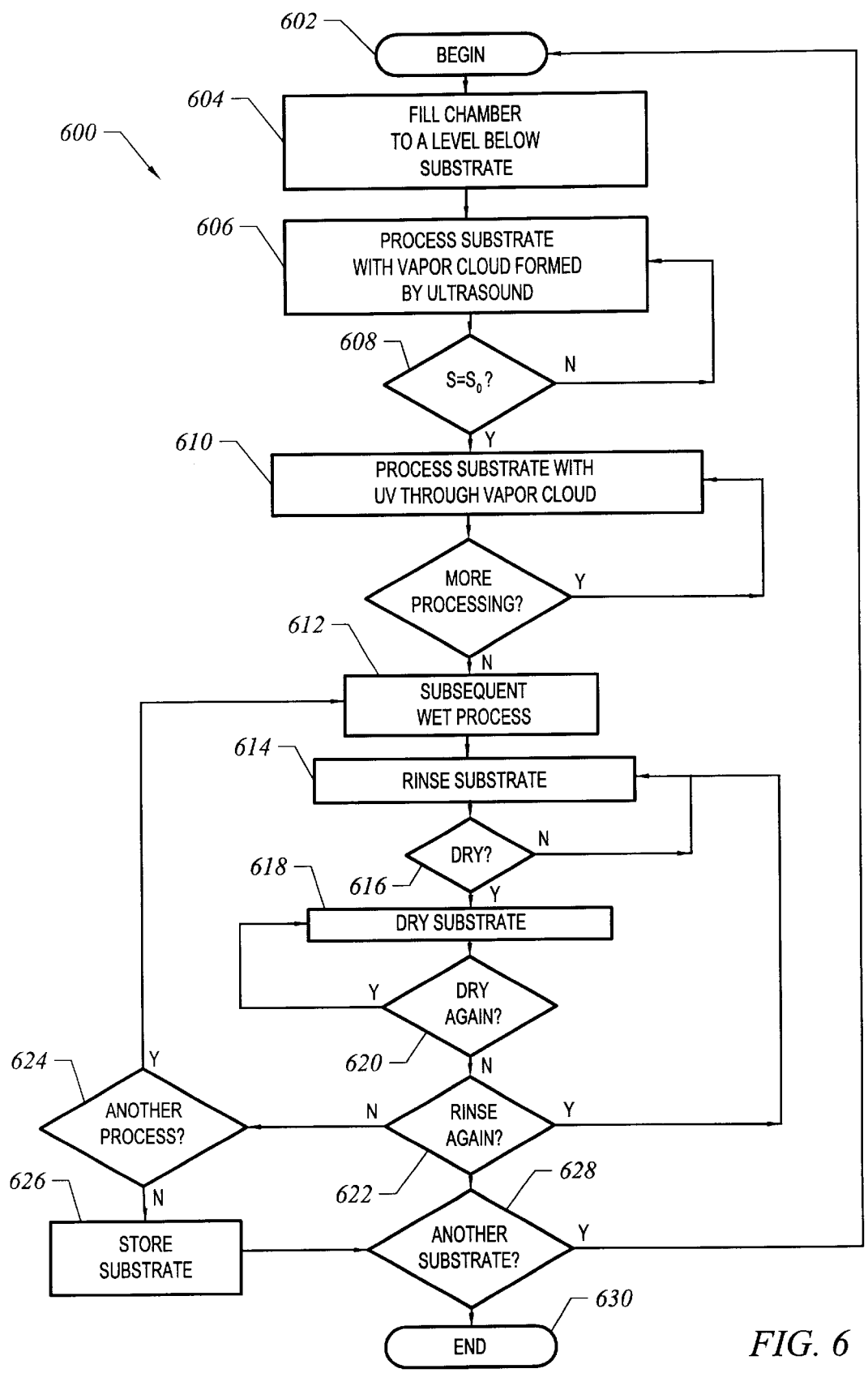
FIG. 6 shows a flow chart of a computer program that implements a method according to an embodiment of the present invention; and To facilitate understanding, identical reference numerals have been used, where possible, to designate identical elements that are common to the figures.

Those skilled in the art would be readily able to devise a computer program to implement the present invention in a wet processing system such as that depicted in FIGS. 1 and 2. FIG. 6 is a flowchart showing the method of the invention implemented under the control of a computer program. The program 600 begins, at step 602, with the introduction of a substrate into one of the wet process chambers 140. For example the program 600 executes computer instructions that cause robot arm 130 to grab a substrate from the rack and move it to one of the wet process chambers 140. Other instructions cause the lid 144 to open and robot arm 130 to insert the substrate. A subsequently executed set of instructions retracts robot arm 130 and closes lid 144.

Next, in step 604, substrate processing begins. For example, the program 600 executes a set of computer instructions that cause certain valves 226 to open and allow process liquid to enter process chamber 140 to a desired level below the substrate 101. For a native oxide etch, a solution containing an acid such as hydrofluoric acid (HF), is typically provided to wet process chamber 140. Process gases can also be introduced to the chamber at this time.

For example, if it desired to completely immerse the substrate in container 420, level sensor 427 could be set just above the top of substrate 101. A signal from level sensor 427 would signal program 600 when the liquid level reached above the top of substrate 101. If it is desired to not immerse substrate 101 level sensor 426 could be set below the bottom of substrate 101. A signal from sensor 426 would cause program 600 to stop filling chamber 420 before the liquid level reaches the bottom of substrate 101. For vapor processing it is generally desirable to set the level of the liquid below the bottom of substrate 101.

The desired level could be a predetermined level based on the geometry of substrate 101 and chamber 140. Alternatively, level sensors 426, 427 could monitor the level. Once desired level is set, ultrasound processing commences at step 606. The program 600 signals the ultrasound generator to provide a signal having a frequency of approximately 950 kHz to the transducer. Megasonic energy from the transducer produces a vapor as described above. The program 600 monitors conditions within chamber 140 by referring, for example, to signals from one or more sensors 224. For example, at step 608, the program 600 executes computer instructions that compare the a sensor signal S indicating etch progress, such as the pH of the process liquid and/or vapor, to a predetermined signal $S_0$ indicating desired rate of etch. The program 600 continues processing until the sensor signal S equals the predetermined signal $S_0$. Alternatively, the program 600 can continue processing for a predetermined period of time $T_0$. Such timing can be accomplished by comparing $T_0$ to a time T measured by the clock 218.

The signal from the sensors 224 can provide feedback to adjust the rate of processing by changing one or more process parameters in such a way as to null the difference between sensor signal S and desired signal $S_0$. For example, the pH of the process liquid and the vapor depend on the concentration of acid in the process liquid. The concentration of acid in the process liquid can be controlled by controlling the flow of acid and deionized water to the chamber with valves 226. If the actual pH of the process liquid is too low, program 600 can direct valves 226 to increase the flow of acid or decrease the flow of deionized water to process chamber 140.

Once the desired process conditions are established, UV vapor processing commences at step 610. The program 600 signals the UV source to turn on. In addition, the program 600 may set the desired UV intensity and, in the case of tunable UV source, the desired wavelength or range of wavelengths. UV processing continues until a desired processing condition has been reached or a predetermined amount of time has elapsed.

Once processing is complete, substrate is removed for subsequent processing at step 612. Subsequent substrate processing can proceed directly to a rinse step 614 or another wet process. Step 612 can include any type of wet process including a UV wet process in the same chamber as steps 603–610. For example, after processing the front side of substrate 101 the robot arm 130 and pick-up 132 can turn substrate around and replace it in process chamber 140 so that UV source 148 can process the back side. Alternatively, the process of step 612 can occur in a different chamber than the process of steps 603–610. After the desired sequence of wet process steps has been executed, the program 600 executes, at step 612, computer instructions that signal the robot arm 130 to remove the substrate from the process chamber 140 and transfer the substrate to the dry/rinse chamber 150 for rinsing and drying.

Rinse step 614 includes, for example, a set of instructions that cause rinse tank 152 to fill with rinse liquid. For example, the program 600 executes a sequence of instructions that open one or more valves 226 that cause deionized water and/or other liquids to enter rinse tank 152. Note that rinse tank 152 can be filled before the substrate is placed into rinse tank 152 or afterwards. Signals from the program 600 start and stop the flow of rinse liquid into the rinse tank 152. Additional instructions may optionally cause transducer 158 to couple sonic energy to the rinse liquid and/or substrate. Rinse can proceed for a predetermined period of time as measured by signals from clock 218.

Once the rinse step 614 is completed, the program 600 decides at step 616 whether to initiate a drying step 618 or repeat rinse step 614. Drying step 618 includes instructions that cause the substrate to be separated from the rinse liquid. Such instructions, for example, cause the robot arm to grip and lift the substrate out of the rinse tank 152. Alternatively program 600 could issue instructions that cause a drain to open and allow rinse liquid to drain away from the substrate. In a preferred embodiment of the invention, program 600 issues instructions to open drain for a short period of time to lower the liquid level in the rinse tank 152. The robot arm 130 then moves pick-up 300 into proximity to an exposed portion of the substrate backside. Substrate pick-up 300 then adheres to the substrate backside by vacuum action as described with respect to FIG. 3 above. The robot arm then lifts the substrate out of the rinse tank 152. Once the substrate is separated from the rinse liquid, program 600 dries the substrate by moving the substrate past a gas stream issuing from the nozzles 156 of the air knife 154. For example, program 600 issues a set of instructions that cause the robot arm to lift the substrate through the manifold 155 while streams of gas are directed against both the front and back sides of the substrate.

After drying, the program 600 decides, at step 620, whether or not to repeat the dry step 618. If drying is not to be repeated, program 600 decides at step 624 whether to repeat rinse step 614 or proceed with processing. If, at step 622, the program decides that additional wet processing is to proceed on the same substrate, program 600 issues instructions to return the substrate to one of the wet processing chambers 140 at step 612. If wet processing is complete, program 600 issues instructions to place the processed substrate in a storage rack at step 626. At step 628 program 600 decides whether to begin the process over with a new substrate at step 602 or end at step 630.

Although program 600 has been described herein in terms of wet process steps alone, those skilled in the art will recognize that dry process steps such as chemical vapor deposition (CVD), physical vapor deposition (PVD) dry etch, etc. can be included within the present invention. Furthermore, the invention is not limited to practice by a single wet process system or cluster tool. Substrates can be transferred, for example, from one wet process system, such as an etch system, to a dry process system, such as a deposition system, and then to another wet process system such as chemical mechanical polishing (CMP). Furthermore the various embodiments of the present invention can be used in processing substrates such as plat panel displays, stepper masks and hard disk media.

Although various embodiments, which incorporate the teachings of the present invention, have been shown and described in detail herein, those skilled in the art can readily devise many other varied embodiments that still incorporate these teachings.

What is claimed is:

1. A method for processing an object by cleaning or etching, comprising:
   supporting the object above a level of a process liquid in a processing chamber; and
   applying megasonic energy to said process liquid to form a vapor including a cloud or a mist that processes the object.

2. The method of claim 1, wherein the object is a semiconductor wafer.

3. The method of claim 1 wherein said process liquid is contained in a process chamber of a wet processing system.

4. The method of claim 1 wherein said vapor chemically reacts with a surface of the object to clean the object.

5. The method of claim 1, wherein said process liquid contains an acid.

6. The method of claim 5, wherein said object is a semiconductor wafer and said vapor removes a native oxide from said wafer.

7. The method of claim 1, wherein said process liquid contains an alcohol.

8. The method of claim 1, further comprising moving the object and a level of said process liquid relative to each other, while applying said megasonic energy to said process liquid.

9. The method of claim 8, wherein said moving the object relative to said liquid level comprises raising or lowering the level of said liquid.

10. The method of claim 1 further comprising:
    diluting said process liquid.

11. The method of claim 10 wherein said process liquid is diluted with deionized water.

12. The method of claim 1 further comprising:
    exposing the object to radiation that is readily absorbed by said process liquid when said process liquid is in the liquid state.

13. The method of claim 12 wherein said radiation is ultraviolet light.

14. The method of claim 12 further comprising:
    introducing ozone to said process chamber.

15. The method of claim 14 further comprising:
    exposing the object to ultraviolet light to form an oxide on a surface of the object.

16. The method of claim 12 further comprising lifting said object by gripping it at a backside thereof.

17. The method of claim 16 wherein said object is lifted with a vacuum wand.

18. A method for processing a substrate by cleaning or etching in a process chamber, comprising:
    supporting the object in the process chamber;
    introducing a process liquid to the process chamber to a level below that of the object;
    forming a vapor including a cloud or a mist in the process chamber by applying megasonic energy to said liquid;
    processing the object with said vapor; and
    exposing the object to ultraviolet light through said vapor.

19. The method of claim 18 wherein said vapor contains ozone.

20. The method of claim 18 wherein said vapor contains ammonia.

21. The method of claim 18 wherein the process liquid contains deionized water.

22. The method of claim 18 wherein said vapor contains an alcohol vapor.

23. The method of claim 18 wherein said process liquid contains an acid.

* * * * *